(12) United States Patent
Bahukhandi et al.

(10) Patent No.: US 9,148,603 B2
(45) Date of Patent: Sep. 29, 2015

(54) OFFSET INJECTION IN AN ANALOG-TO-DIGITAL CONVERTER

(71) Applicant: Semiconductor Components Industries, LLC, Phoenix, AZ (US)

(72) Inventors: Ashirwad Bahukhandi, Santa Clara, CA (US); Taehee Cho, Palo Alto, CA (US); Nikolai Bock, San Jose, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 175 days.

(21) Appl. No.: 13/890,702

(22) Filed: May 9, 2013

(65) Prior Publication Data

US 2013/0308028 A1    Nov. 21, 2013

Related U.S. Application Data

(60) Provisional application No. 61/647,497, filed on May 15, 2012.

(51) Int. Cl.
| | |
|---|---|
| *H03M 1/12* | (2006.01) |
| *H04N 5/378* | (2011.01) |
| *H03M 1/10* | (2006.01) |
| *H03M 1/46* | (2006.01) |

(52) U.S. Cl.
CPC ............ *H04N 5/378* (2013.01); *H03M 1/1023* (2013.01); *H03M 1/12* (2013.01); *H03M 1/466* (2013.01)

(58) Field of Classification Search
CPC ... H03M 1/466; H03M 1/804; H03M 1/1245; H03M 1/46; H03M 1/403; H03M 1/462; H03M 1/1009; H03M 1/06; H03M 1/1023

USPC .................. 341/118, 120, 121, 155, 172
See application file for complete search history.

(56) References Cited

U.S. PATENT DOCUMENTS

| | | | | |
|---|---|---|---|---|
| 4,195,282 | A   * | 3/1980  | Cameron ...................... | 341/172 |
| 5,012,247 | A   * | 4/1991  | Dillman ....................... | 341/172 |
| 5,852,415 | A    | 12/1998 | Cotter et al. | |
| 6,252,536 | B1   | 6/2001  | Johnson et al. | |
| 6,433,724 | B1 * | 8/2002  | Confalonieri et al. ......... | 341/155 |
| 6,559,789 | B1 * | 5/2003  | Somayajula ................. | 341/172 |
| 6,870,496 | B2 * | 3/2005  | Krymski et al. .............. | 341/172 |
| 6,956,520 | B2 * | 10/2005 | Leung et al. ................. | 341/172 |
| 7,161,512 | B1 * | 1/2007  | Keskin ......................... | 341/118 |
| 7,834,796 | B2 * | 11/2010 | Xu et al. ....................... | 341/172 |
| 7,893,860 | B2 * | 2/2011  | Cho et al. ..................... | 341/161 |
| 7,969,167 | B2 * | 6/2011  | Khanna et al. ............... | 324/686 |

(Continued)

*Primary Examiner* — Linh Nguyen
(74) *Attorney, Agent, or Firm* — Treyz Law Group

(57) ABSTRACT

An electronic device may have one or more analog-to-digital converters (ADCs). The ADCs may be used in digitizing signals from an image sensor. In order to ensure that input signals received by an ADC are not clipped, the input signals may be positively or negatively offset by a desired amount. Offsetting the input signals may ensure that the offset input signals wall within the acceptable input range of the ADCs. Offset injection may be accomplished using capacitors that are also used for analog-to-digital conversion. As an example, the ADC may be a successive approximation-type ADC that uses capacitors in a binary search for the digital value most accurately representing an input analog value. The capacitors of the ADC may be used for the successive approximation process and for offset injection. The offset injection may be digitally canceled out following digitization of the input analog signal.

19 Claims, 5 Drawing Sheets

(56) References Cited

U.S. PATENT DOCUMENTS

| | | | |
|---|---|---|---|
| 8,378,863 B2* | 2/2013 | Ishikawa | 341/118 |
| 2003/0063026 A1 | 4/2003 | Nandy | |
| 2006/0044170 A1* | 3/2006 | Boemler | 341/155 |
| 2007/0035431 A1* | 2/2007 | Hurrell et al. | 341/155 |
| 2011/0215956 A1* | 9/2011 | Ishikawa | 341/110 |
| 2011/0234433 A1* | 9/2011 | Aruga et al. | 341/110 |

* cited by examiner

OFFSET INJECTION IN AN ANALOG-TO-DIGITAL CONVERTER

This application claims the benefit of provisional patent application No. 61/647,497, filed May 15, 2012, which is hereby incorporated by reference herein in its entirety.

BACKGROUND

The present invention relates to imaging systems and, more particularly, to imaging systems that may have one or more analog-to-digital converters with offset injection.

Electronic devices such as cellular telephones are often provided with camera sensors. The camera sensors are formed from arrays of image sensing pixels. Typically, an analog-to-digital converter (ADC) is used to read out image values (and reset values, when a correlated double sampling (CDS) scheme is used) from the image sensing pixels. Traditional ADCs require input signals to fall within a particular range. Due to noise, overly large or overly small values from pixels, and other factors, the signals provided from the image sensing pixels to the ADCs often do not fall within the required input range of traditional ADCs. As a result, the signals from the imaging sensing pixels can be clipped, resulting in the loss of image data and dynamic range.

DETAILED DESCRIPTION

Figure 1:
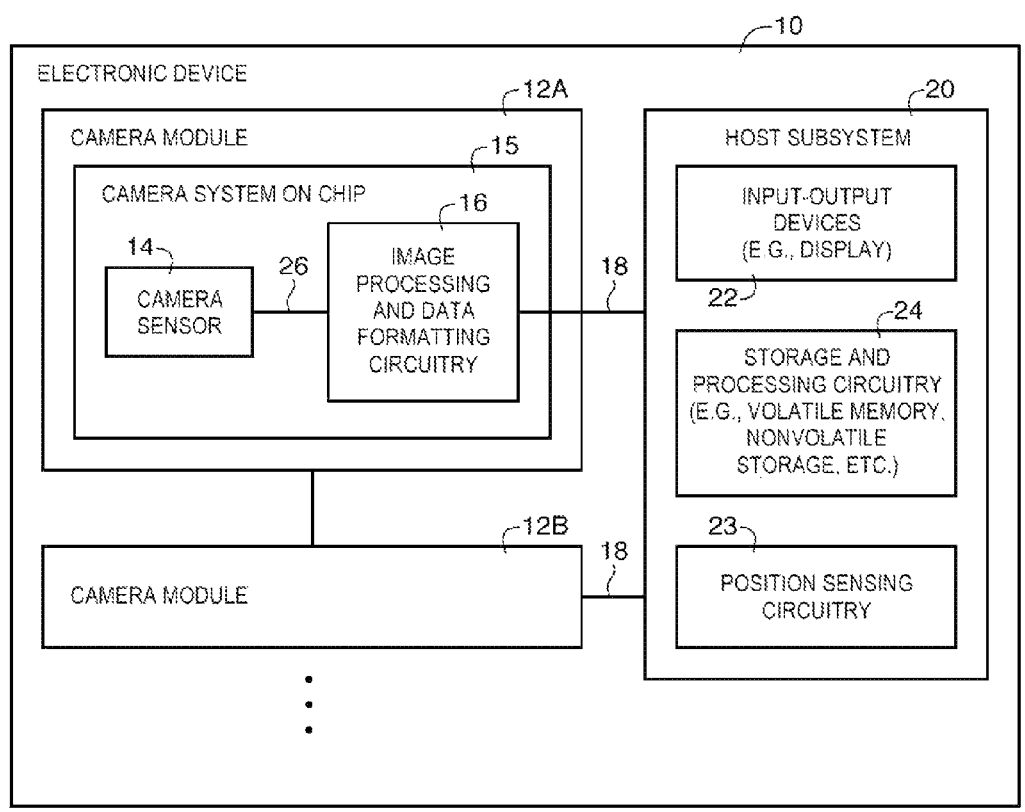
FIG. 1 is a diagram of an electronic device and computing equipment that may include an analog-to-digital converter with offset injection functionality in accordance with embodiments of the present invention.

Digital camera modules are widely used in electronic devices. An electronic device with a digital camera module is shown in FIG. 1. Electronic device 10 may be a digital camera, a laptop computer, a display, a computer, a cellular telephone, or other electronic device. Device 10 may include one or more imaging systems such as imaging systems 12A and 12B (e.g., camera modules 12A and 12B) each of which may include one or more image sensors 14 and corresponding lenses. During operation, a lens focuses light onto an image sensor 14. The lens may have a fixed aperture. The pixels in image sensor 14 include photosensitive elements that convert the light into digital data. Image sensors may have any number of pixels (e.g., hundreds or thousands or more). A typical image sensor may, for example, have millions of pixels (e.g., megapixels). In high-end equipment, sensors with 10 megapixels or more are not uncommon. In at least some arrangements, device 10 may include two (or more) image sensors 14, which may capture images from different perspectives. When device 10 includes two image sensors 14, device 14 may be able to capture stereo images.

Still and video image data from camera sensor 14 may be provided to image processing and data formatting circuitry 16 via path 26. Image processing and data formatting circuitry 16 may be used to perform image processing functions such as adjusting white balance and exposure and implementing video image stabilization, image cropping, image scaling, etc. Image processing and data formatting circuitry 16 may also be used to compress raw camera image files if desired (e.g., to Joint Photographic Experts Group or JPEG format).

In a typical arrangement, which is sometimes referred to as a system on chip or SOC arrangement, camera sensor 14 and image processing and data formatting circuitry 16 are implemented on a common integrated circuit 15. The use of a single integrated circuit to implement camera sensor 14 and image processing and data formatting circuitry 16 can help to minimize costs. If desired, however, multiple integrated circuits may be used to implement circuitry 15. In arrangements in which device 10 includes multiple camera sensors 14, each camera sensor 14 and associated image processing and data formatting circuitry 16 can be formed on a separate SOC integrated circuit (e.g., there may be multiple camera system on chip modules such as modules 12A and 12B).

Circuitry 15 conveys data to host subsystem 20 over path 18. Circuitry 15 may provide acquired image data such as captured video and still digital images to host subsystem 20.

Electronic device 10 typically provides a user with numerous high level functions. In a computer or advanced cellular telephone, for example, a user may be provided with the ability to run user applications. To implement these functions, electronic device 10 may have input-output devices 22 such as projectors, keypads, input-output ports, and displays and storage and processing circuitry 24. Storage and processing circuitry 24 may include volatile and nonvolatile memory (e.g., random-access memory, flash memory, hard drives, solid state drives, etc.). Storage and processing circuitry 24 may also include processors such as microprocessors, microcontrollers, digital signal processors, application specific integrated circuits, etc.

Device 10 may include position sensing circuitry 23. Position sensing circuitry 23 may include, as examples, global positioning system (GPS) circuitry, radio-frequency-based positioning circuitry (e.g., cellular-telephone positioning circuitry), gyroscopes, accelerometers, compasses, magnetometers, etc.

Figure 2:
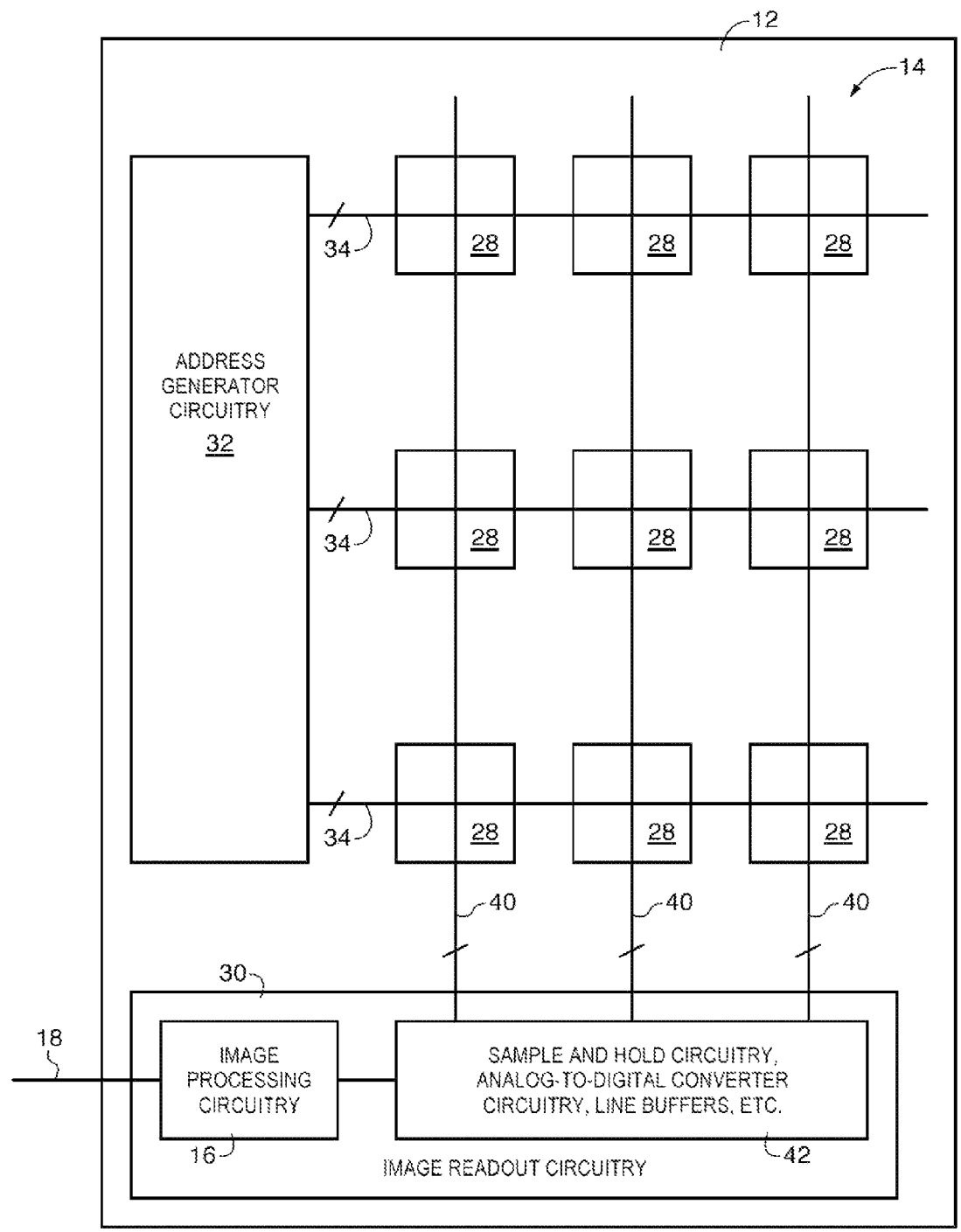
FIG. 2 is a diagram of an illustrative array of light-sensitive imaging pixels that may form a camera in the electronic device of FIG. 1 and of associated control circuitry that may include the analog-to-digital converter of FIG. 1 in accordance with embodiments of the present invention.

An example of an arrangement for sensor array 14 is shown in FIG. 2. As shown in FIG. 2, device 10 may include an array 14 of pixels 28 coupled to image readout circuitry 30 and address generator circuitry 32. As an example, each of the pixels in a row of array 14 may be coupled to address generator circuitry 32 by one or more conductive lines 34. Array 14 may have any number of rows and columns. In general, the size of array 14 and the number of rows and columns in array 14 will depend on the particular implementation. While rows and columns are generally described herein as being horizontal and vertical rows and columns may refer to any grid-like structure (e.g., features described herein as rows may be arranged vertically and features described herein as columns may be arranged horizontally).

Address generator circuitry 32 may generate signals on paths 34 as desired. For example, address generator circuitry 32 may generate reset signals on reset lines in paths 34, transfer signals on transfer lines in paths 34, and row select (e.g., row readout) signals on row select lines in paths 34 to control the operation of array 14. If desired, address generator circuitry 32 and array 14 may be integrated together in a single integrated circuit (as an example).

Signals 34, generated by address generator circuitry 32 as an example, may include signals that dynamically adjust the resolution of array 14. For example, signals 34 may include binning signals that cause pixels 28 in a first region of array 14 to be binned together (e.g., with a 2-pixel binning scheme, with a 3-pixel binning scheme, or with a pixel binning scheme of 4 or more pixels) and that cause pixels 28 in a second region of array 14 to either not be binned together or to be binned together to a lesser extent than the first region. In addition, signals 34 may cause pixels 28 in any number of additional (e.g., third, fourth, fifth, etc.) regions of array 14 to be binned together to any number of different, or identical, degrees (e.g., 2-pixel binning schemes, 3-or-more-pixel binning schemes, etc.).

Image readout circuitry 30 may include circuitry 42 and image processing and data formatting circuitry 16. Circuitry 42 may include sample and hold circuitry, analog-to-digital converter circuitry, and line buffer circuitry (as examples). As one example, circuitry 42 may be used to measure signals in pixels 28 and may be used to buffer the signals while analog-to-digital converters in circuitry 42 convert the signals to digital signals. In a typical arrangement, circuitry 42 reads signals from rows of pixels 28 one row at a time over lines 40. With another suitable arrangement, circuitry 42 reads signals from groups of pixels 28 (e.g., groups formed from pixels located in multiple rows and columns of array 14) one group at a time over lines 40. The digital signals read out by circuitry 42 may be representative of charges accumulated by pixels 28 in response to incident light. The digital signals produced by the analog-to-digital converters of circuitry 42 may be conveyed to image processing and data formatting circuitry 16 and then to host subsystem 20 (FIG. 1) over path 18.

Figure 3:
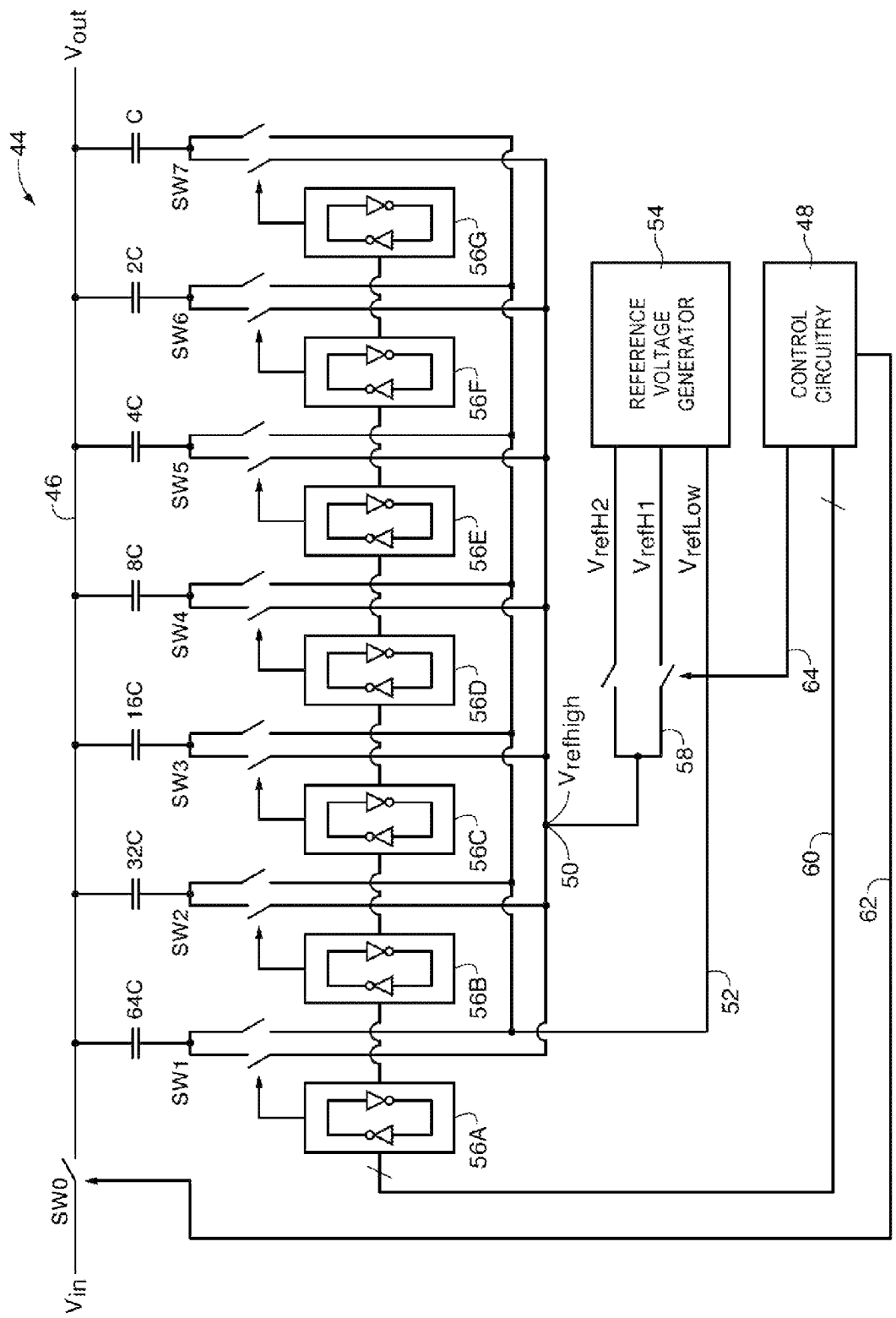
FIG. 3 is a schematic diagram of an illustrative analog-to-digital converter (ADC) that may have offset injection functionality such as the ADC of FIGS. 1 and 2 in accordance with an embodiment of the present invention.

An illustrative analog-to-digital converter (ADC) 44 such as an ADC in circuitry 42 of FIG. 2 is shown in FIG. 3. As shown in FIG. 3, ADC 44 may include offset injection circuitry. Offset injection circuitry, such as that shown in FIG. 3, may be used to inject a configurable mount of positive or negative charge in order to input that signals input into ADC 44 are not clipped (by being outside of the sampling range of ADC 44). Such arrangements help increase the dynamic range of image sensor 14.

The sampling range (e.g., input range) of ADC 44 may extend from the lowest analog input voltage convertible into a digital representation (e.g., a multi-bit digital representation of all zeros) to the highest analog input voltage convertible into a digital representation (e.g., a multi-bit digital representation of all ones). Input voltages below the lowest analog input voltage may be digitally indistinguishable from the lowest analog input voltage after passing through ADC 44 (e.g., input voltages below the lowest analog input voltage may be "clipped"). Similarly, Input voltages above the highest analog input voltage may be digitally indistinguishable from the highest analog input voltage after passing through ADC 44 (e.g., input voltages above the highest analog input voltage may be "clipped").

In general, image sensor 14 may include any number of ADCs 44. As examples, image sensor 14 may include a single ADC, a number of ADCs equal to some fraction of the number of columns of pixels 28 (e.g., if there are X columns, there may be X/2, X/3, X/4, etc. ADCs), a number of ADCs equal to the number of columns of pixels 28, a number of ADC's equal to a multiple of the number of columns of pixels (e.g., if there are X columns, there may be 2X, 3X, 4X, etc., ADCs). In arrangements in which there are different numbers of ADCs and columns of pixels, there may be multiplexing circuitry coupled between the columns of array 14 and the ADCs.

As shown in FIG. 3, each ADC 44 may receive input signals over an input line Vin and may output signals over output line Vout. The input line Vin may be coupled to the output of selected pixels 28 one at a time over lines 40. As an example, when ADC 44 is reading out a pixel, the input line Vin may be coupled to an output driver of that pixel (e.g., a source-follower transistor of that pixel). The input line Vin may be selectively connected to ADC 44 by closing switch SW0. Conversely, the input line Vin may be selectively isolated from ADC 44 by opening switch SW0. ADC 44 may include additional circuitry not shown in FIG. 3 such as comparator circuitry, which may receive signals on output line Vout.

ADC 44 may be a successive approximation-type ADC (as an example). In this type of arrangement, ADC 44 may include an array of binary-weighted capacitors such as capacitors C, 2C, 4C, 8C, 16C, 32C, and 64C (as shown in FIG. 3). Each of the capacitors may be coupled between a common conductive line 46 and a respective one of the switches SW1-SW7. Each of the switches SW1-SW7 may be a double pole, double throw (DPDT) switch and may be formed from CMOS components such as transistors and logic gates. Each of the switches SW1-SW7 may have an output terminal coupled to a respective one of the capacitors (e.g., C, 2C, . . . , and 64C), may have a first input terminal coupled to a conductive line 50 carrying Vrefhigh, and may have a second input terminal coupled to a conductive line 52 carrying Vreflow. Given the DPDT nature of switches SW1-SW7, each of the switches SW1-SW7 may, in a first configuration, couple conductive line 50 to its respective capacitor and may, in a second configuration, couple conductive line 52 to its respective capacitor.

Each of the switches SW1-SW7 may have a control terminal coupled to a respective one of the latches 56A-56G. Latches 56 may be, as an example, a memory element formed from cross-coupled inverters. As another example, latches 56 may be flip-flops or other suitable circuitry having at least two stable states and capable of storing state information. If desired, the state of each latch 56 may determine whether its associated switch SW connects Vrefhigh or Vreflow to its associated capacitor. As an example, when latch 56A is sending a digital "1" to switch SW1, then SW1 may couple Vrefhigh to capacitor 64C. Following this example, when latch 56B is sending a digital "0" to switch SW1, then switch SW1 may couple Vreflow to capacitor 64C. This is merely an illustrative example. If desired, switches such as switch SW1 may respond in the opposite manner.

If desired, switches latches 56A-56G may be omitted and switches SW1-SW7 may be controlled more directly by control circuitry 48.

Reference voltage generator 54 may generate the reference voltages Vrefhigh and Vrefhigh using any desirable technique. As examples, reference voltage generator 54 may generate the reference voltages Vrefhigh and Vrefhigh using bandgap reference generator circuitry.

In at least some arrangements, the magnitude of Vrefhigh may change over time. As illustrated in the example of FIG. 3, reference voltage generator 54 may generate two versions of Vrefhigh, VrefH1 and VrefH2, and a selected one of the versions of Vrefhigh may be coupled to conductive line 50 by switch 58. As an example, VrefH1 may be lower than VrefH2, while remaining greater than Vreflow. Switch 58 may be a DPDT similar to switches SW1-SW7 and may be controlled by control signals from control circuitry 48. As another example, switch 58 may be omitted and reference voltage generator may generate (in addition to Vreflow) a time-varying version of Vrefhigh (e.g., Vrefhigh may vary over time between VrefH1 and VrefH2). These are merely illustrative examples.

Control circuitry 48 may control switches SW0-SW7 and switch 58 over control lines 60, 62, and 64. Control lines 60 may include, in at least one embodiment, a number of individual control lines proportional to the number of switches SW1-SW7. In some embodiments, control lines 60 may include one or more address lines and one or more word lines for individually programming latches 56A-56G. In arrangements in which latches 56A-56G are omitted, control lines 60 may include one or more control lines for each of the switches SW1-SW7 (e.g., for each of the switches SW1-SW7, there may be one or more control lines directly controlling that switch).

Figure 4:
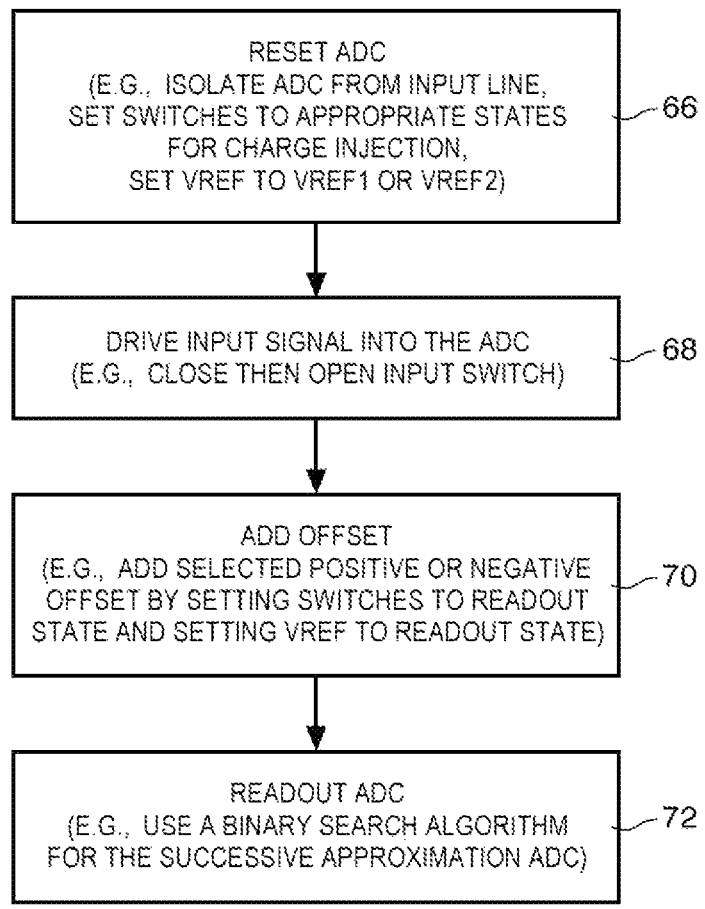
FIG. 4 is a flowchart of illustrative steps involved in using an analog-to-digital converter (ADC) having offset injection functionality such as the ADC of FIGS. 1-3 in accordance with embodiments of the present invention.

A flowchart of illustrative steps involved in using ADC 44 of FIG. 3 is shown in FIG. 4.

In step 66, ADC 44 may be reset. Resetting ADC 44 may include generating control signals with control circuitry 48 that open switch SW0, that set the switches SW1-SW7 to a desired initial configuration, and that set switch 58 to a desired initial position.

The initial configuration and position of switches SW1-SW7 and 58 may determine whether or not ADC 44 utilizes an offset injection and, when ADC utilizes an offset injection, the magnitude of the offset injection and whether the offset injection is positive or negative. In arrangements in which ADC 44 does not utilize an offset injection (as an example), the initial configuration and position of switches SW1-SW7 and 58 may have each of the switches SW1-SW7 coupling their respective capacitor to the conductive line 50 (carrying Vrefhigh) and switch 58 coupling conductive line 50 to VrefH1.

In arrangements in which a maximum amount of positive offset injection is desired, the initial configuration and position of switches SW1-SW7 and 58 may have each of the switches SW1-SW7 coupling their respective capacitor to the conductive line 52 (carrying Vreflow) and switch 58 coupling conductive line 50 to VrefH1. In arrangements in which a lesser amount of positive offset injection is desired, the initial configuration may be modified such that at least one of the switches SW1-SW7 couples its respective capacitor to conductive line 52 (carrying Vreflow) and that at least one of the switches SW1-SW7 couples its respective capacitor to conductive line 50 (carrying Vrefhigh). The amount of positive offset injection can be customized by determining which switches SW1-SW7 connect their associated capacitor to conductive line 52 (instead of line 50, as in the zero offset arrangement). In general, having SW1 connect capacitor 64C to conductive line 52 (instead of line 50) will result in twice the amount of positive charge injection as having SW2 connect capacitor 32C to conductive line 52 (instead of line 50). This example extends all the way through switch S7 and capacitor C. In this way, binary control of latches 56A-56G and switches SW1-SW7 results in a binary selection of the magnitude of positive injection for ADC 44.

In arrangements in which a maximum amount of negative offset injection is desired, the initial configuration and position of switches SW1-SW7 and 58 may have each of the switches SW1-SW7 coupling their respective capacitor to the conductive line 50 (carrying Vrefhigh) and switch 58 coupling conductive line 50 to VrefH2. In arrangement in which a lesser amount of negative offset injection is desired, the techniques of positive charge injection previously discussed can be used. (For these reasons, the difference between VrefH1 and VrefH2 may be set such that the maximum amount of negative offset injection is equal to or even slightly larger than the maximum amount of positive offset injection.) As an example, the next-largest amount of negative offset injection (i.e., just smaller than the "maximum" amount of negative offset injection) may be accomplished by modifying the initial configuration of latch 56G and switch SW7, such that switch SW7 couples capacitor C to conductive line 52 (instead of line 50). The smallest amount of non-zero negative charge injection may be accomplished by modifying the initial configuration such that each of switches SW1-SW7 couples its respective capacitor to conductive line 52 (instead of line 50). In general, having SW1 connect capacitor 64C to conductive line 52 (instead of line 50) will reduce the amount of negative charge injection twice as much as having SW2 connect capacitor 32C to conductive line 52 (instead of line 50). This example extends all the way through switch S7 and capacitor C. In this way, binary control of latches 56A-56G and switches SW1-SW7 results in a binary selection of the magnitude of negative injection for ADC 44.

In step 68 and while ADC 44 is in its initial configuration (as set in step 66), an input signal may be driven onto the upper terminals of capacitors C-64C (e.g., onto conductive line 46). As an example, control circuitry 48 may generate control signals on control line 62 that close switch SW0 for at least a period of time sufficient to drive the input signal onto capacitors C-64C and that then open switch SW1. In general, device 10 may include an output buffer (not shown) that drives the input signal Vin onto line 46. In image sensors, the output buffer may be a source-follower transistor associated with one or more pixels (as an example).

In step 70, offset injection operations may occur to inject offset to the input signal Vin now stored by capacitors C-64C of ADC 44. In particular, switches SW1-SW7 and switch 58 may be reconfigured into an initial readout state. In arrangements in which no offset is being added to the input signal Vin, there may be no need to reconfigure switches SW1-SW7 and 58.

When it is desired to add positive offset to the input signal Vin, reconfiguring switches SW1-SW7 (and switch 58) may include configuring each of the switches SW1-SW7 to couple its respective capacitor to Vrefhigh (e.g., to conductive line 50). Positive offset is injected in a magnitude determined by the number of switches SW1-SW7 configured in step 66 to couple their respective capacitor to Vreflow (e.g., to conductive line 52). In particular, when the state of a particular switch changes (from coupling line 52 to coupling line 50 to capacitor 64C) an amount of positive charge proportional to the capacitance of the capacitor associated with that particular is injected into the input signal Vin. As an example, when the state of SW1 changes (from coupling line 52 to coupling line 50 to capacitor 64C) a first amount of positive charge proportional to the capacitance of capacitor 64C is injected into the input signal Vin. Similarly, when the state of SW2 changes (from coupling line 52 to coupling line 50 to capacitor 32C) a second amount of positive charge proportional to the capacitance of capacitor 32C is injected into the input signal Vin. (The first amount of charge may be approximately twice the second amount of positive charge.)

When it is desired to add negative offset to the input signal Vin, reconfiguring switches SW1-SW7 (and switch 58) may include configuring each of the switches SW1-SW7 to couple its respective capacitor to Vrefhigh (e.g., to conductive line 50) and configuring switch 58 to couple VrefH1 (instead of VrefH2) to conductive line 50. In arrangements in which a maximum amount of negative offset is injected, step 70 includes reconfiguring switch 58, but not switches SW1-SW7 as switches SW1-SW7 were already coupling their capacitors to Vrefhigh. Because VrefH2 is greater than VrefH2, reconfigure switch 58 pulls the voltage on the lower terminals of capacitors C-64 down, which pulls the upper terminals of capacitors C-64 down by an approximately equal amount (at least when injecting a maximum amount of negative offset). The magnitude of the negative offset injection may be factor of the difference between VrefH1 and VrefH2.

In arrangements in which less than the maximum amount of negative offset is injected to the input signal Vin, step 70 may include a negative offset injection step and a positive offset injection step. As an example, step 70 may include an initial negative offset injection step in which switch 58 is reconfigured to couple VrefH1 to conductive line 50. In the initial negative offset injection step, an amount of negative offset is injected, where the amount is determined by which of the switches SW1-SW7 are configured (in step 66) to initially couple their capacitors to conductive line 50. In particular, each switch SW1-SW7 which couples its respective capacitor to conductive line 50 during the negative offset injection step will contribute to the magnitude of negative offset injected. In a subsequent positive offset injection step, all of the switches SW1-SW7 may be configured to couple their capacitors to conductive line 50. In the positive offset injection step, an amount of positive offset is injected, where the amount is determined by which of the switches SW1-SW7 are configured (in step 66) to initially couple their capacitors to conductive line 52. The amount of negative offset injected step may be partially offset by the amount of positive charge injected (resulting in a less than maximum amount of negative offset injection). While the previous example illustrative an arrangement in which the negative offset injection step occurred first, this is merely an illustrative example and, if desired, the positive offset injection step may occur first.

Following the operations of step 70, ADC 44 may be in an initial readout state. In step 72, the now-offset input signal Vin may be readout. As an example, ADC 44 may be read out using a successive approximately technique. A successive approximation technique may involve performing a binary search to determine a digital representation of the input signal Vin. With one suitable arrangement, the successive approximation technique involve switching SW1 from conductive line 50 to conductive line 52 and then, based on the resulting change in the output signal Vout, determining if the most-significant (i.e., highest order) bit of the digital representation of the input signal Vin should be a "1" or a "0." After the most-significant bit is determined, switch SW1 is left in an appropriate state (which may be coupling capacitor 64C to line 50 or 52, based on whether the most-significant bit of the digital representation of the input signal Vin is a "1" or a "0") and switch SW2 may be switched from conductive line 50 to conductive line 52. The resulting change in the output signal Vout is then used to determine if the second-most-significant (i.e., second highest order) bit of the digital representation of the input signal Vin should be a "1" or a "0."

Step 72 may include a correction process in which the offset injection added in step 70 is subtracted. In particular, the digital representation of the input signal Vin calculated when reading out ADC 44 may be adjusted to cancel out the positive or negative offset injected in step 70.

Figure 5:
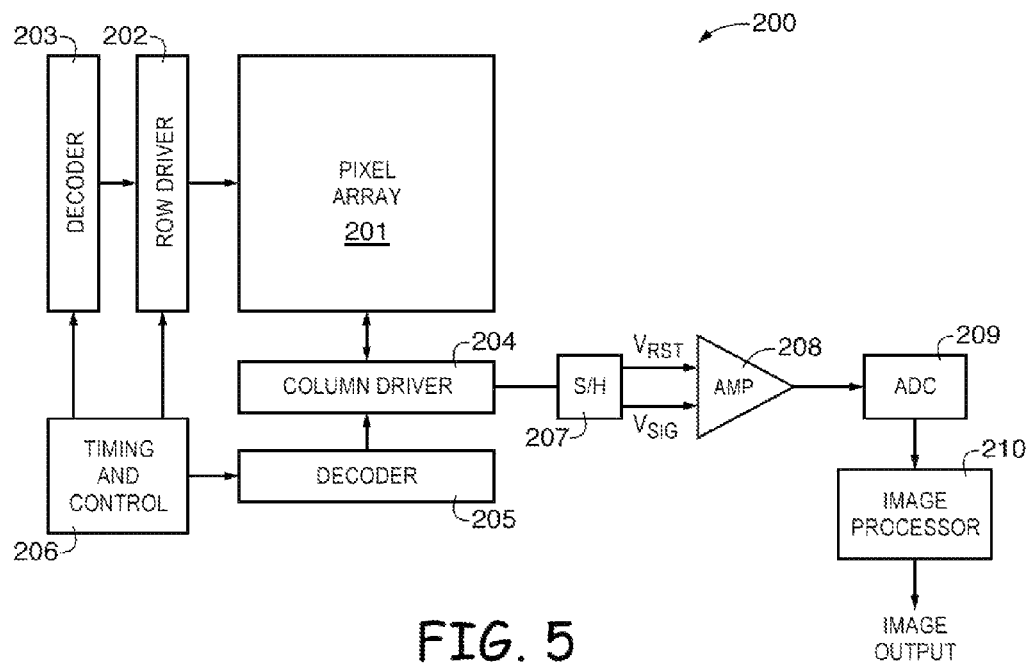
FIG. 5 is a block diagram of an imager employing one or more of the embodiments of FIGS. 1-4 in accordance with embodiments of the present invention.

FIG. 5 illustrates a simplified block diagram of imager 200 (e.g., an imager that may include an analog-to-digital converter such as ADC 44 having offset injection capabilities). Pixel array 201 includes a plurality of pixels containing respective photosensors arranged in a predetermined number of columns and rows. The row lines are selectively activated by row driver 202 in response to row address decoder 203 and the column select lines are selectively activated by column driver 204 in response to column address decoder 205. Thus, a row and column address is provided for each pixel.

CMOS imager 200 is operated by a timing and control circuit 206, which controls decoders 203, 205 for selecting the appropriate row and column lines for pixel readout, and row and column driver circuitry 202, 204, which apply driving voltages to the drive transistors of the selected row and column lines. The pixel signals, which typically include a pixel reset signal Vrst and a pixel image signal Vsig for each pixel are sampled by sample and hold circuitry 207 associated with the column driver 204. A differential signal Vrst-Vsig is produced for each pixel, which is amplified by amplifier 208 and digitized by analog-to-digital converter 209. The analog-to-digital converter 209 may formed in the manner of ADC 44 of FIG. 3 and operated as described in connection with FIG. 4. The analog to digital converter 209 converts the analog pixel signals to digital signals, which are fed to image processor 210 which forms a digital image.

Figure 6:
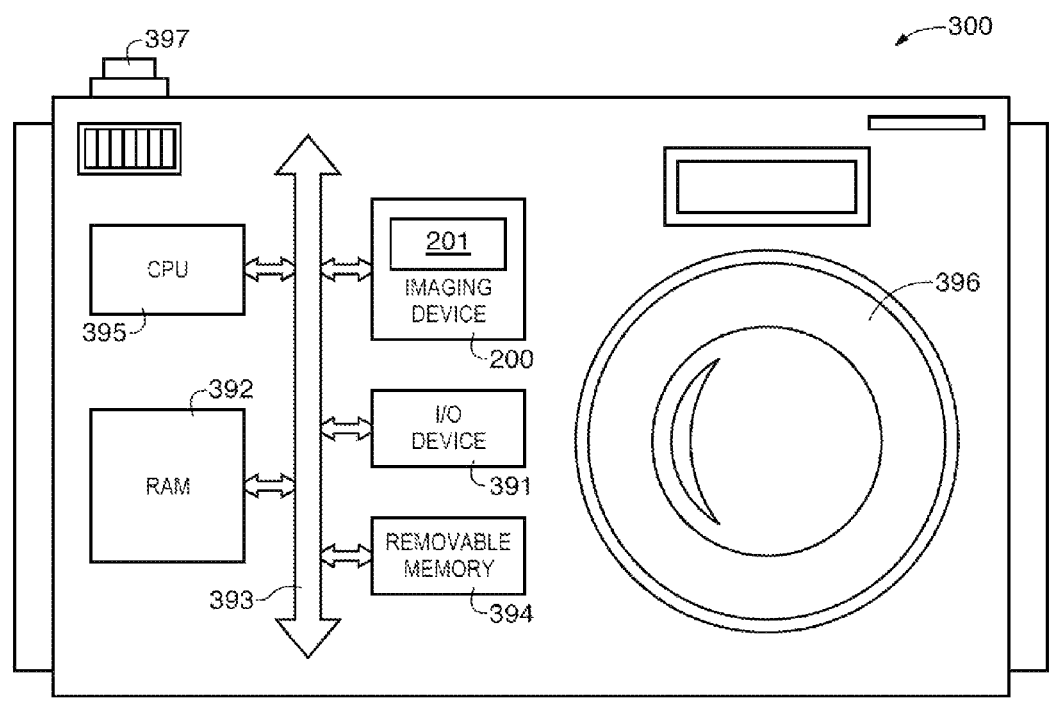
FIG. 6 is a block diagram of a processor system employing the imager of FIG. 7 in accordance with embodiments of the present invention.

FIG. 6 shows in simplified form a typical processor system 300, such as a digital camera, which includes an imaging device such as imaging device 200 (e.g., an imager that may include an analog-to-digital converter such as ADC 44 having offset injection capabilities). Processor system 300 is exemplary of a system having digital circuits that could include imaging device 200. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating analog-to-digital converter circuitry that may have offset injection, which may help alight input signals with an input range of the analog-to-digital converter circuitry.

An electronic device may include one or more analog-to-digital converters (ADCs), which may be used in connection with an image sensor. As an example, analog signals representative of image data (and reset data) from imaging sensing pixels may be digitized in image readout circuitry including at least one analog-to-digital converter.

In order to ensure that the analog signals received by the ADC can be properly digitized, it may be desirable to add positive or negative offset to the analog signals. Such arrangements may be beneficial when the analog signals are initially outside the input range of the ADC and where the added offset places the analog signals within the input range of the ADC. Offset can be added using binary-weighted capacitors (as an example). If desired, the capacitors may also be used in conversion (i.e., digitization) of the (now offset) analog input signals into digital form. Following digitization, the ADC may generate a multi-bit digital signal representative of the offset input signal. If desired, the ADC may digitally remove the added offset from the multi-bit digital signal, so that the multi-bit digital signal is representative of the original input signal.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of operating an analog-to-digital converter, wherein the analog-to-digital converter comprises a plurality of capacitors each having a first terminal and a second terminal, a plurality of switches, at least a first conductive line at a first reference voltage, and at least a second conductive line at a second reference voltage that is different from the first reference voltage, wherein each of the switches is associated with the first terminal of a respective one of the capacitors, wherein each of the switches has a first configuration in which that switch couples the first terminal of its associated capacitor to the first conductive line at the first reference voltage and has a second configuration in which that switch couples the first terminal of its associated capacitor to the second conductive line at the second reference voltage, the method comprising:
setting at least one of the switches in its first configuration and setting at least one of the switches in its second configuration;
while at least the one of the switches is set in its first configuration and while at least the one of the switches is set in its second configuration, driving an input analog voltage onto a third conductive line, wherein the second terminals of the capacitors are coupled to the third conductive line; and
after driving the input analog voltage onto the third conductive line, setting all of the switches into their first configurations so that all of the first terminals of the capacitors are coupled to the first conductive line at the first reference voltage.

2. The method defined in claim 1 wherein setting all of the switches into their first configurations so that all of the first terminals of the capacitors are coupled to the first conductive line at the first reference voltage after driving the input analog voltage onto the third conductive line comprises offsetting the input analog voltage.

3. The method defined in claim 2 wherein offsetting the input analog voltage comprises adding a given amount of offset to the input analog voltage, the method further comprises:
varying the given amount of offset to be added to the input analog voltage by varying how many and which switches are set in their first configuration and how many and which switches are set in their second configuration as part of the setting of the at least one of the switches in its first configuration and the setting of the at least one of the switches in its second configuration.

4. The method defined in claim 2 further comprising:
after offsetting the input analog voltage, digitizing the offset input analog voltage.

5. The method defined in claim 4 wherein digitizing the offset input analog voltage comprises successively approximating a multi-bit digital representation of the offset input analog voltage.

6. The method defined in claim 4 wherein the plurality of capacitors comprises a plurality of binary-weighted capacitors and wherein digitizing the offset input analog voltage comprises successively approximating a multi-bit digital representation of the offset input analog voltage.

7. The method defined in claim 4 wherein the plurality of capacitors comprises at least first, second, and third capacitors, wherein the first capacitor has a first capacitance, wherein the second capacitor has a second capacitance that is approximately half of the first capacitance, and wherein the third capacitor has a third capacitance that is approximately half of the second capacitance, wherein the plurality of switches comprises at least first, second, and third switches respectively associated with the first, second, and third binary-weighted capacitors, and wherein digitizing the offset input analog voltage comprises:
determining a first bit of a multi-bit digital representation of the offset input analog voltage at least by setting the first switch in its second configuration;
determining a second bit of a multi-bit digital representation of the offset input analog voltage at least by setting the second switch in its second configuration, wherein the second bit is of a lower order than the first bit; and
determining a third bit of a multi-bit digital representation of the offset input analog voltage at least by setting the third switch in its second configuration, wherein the third bit is of a lower order than the second bit.

8. The method defined in claim 4 wherein digitizing the offset input analog voltage comprises calculating a multi-bit digital representation of the offset input analog voltage and wherein offsetting the input analog voltage comprises adding a given offset, the method further comprising:
after calculating the multi-bit digital representation of the offset input analog voltage, cancelling out the given offset and calculating a multi-bit digital representation of the input analog voltage.

9. The method defined in claim 1 wherein the first reference voltage is higher than the second reference voltage and wherein setting all of the switches into their first configurations so that all of the first terminals of the capacitors are coupled to the first conductive line at the first reference voltage after driving the input analog voltage onto the third conductive line comprises adding a positive voltage offset to the input analog voltage.

10. The method defined in claim 1 wherein the analog-to-digital converter comprises circuitry that varies the first reference voltage on the first conductive line over time between third and fourth reference voltages and wherein the third reference voltage is greater than the fourth reference voltage, the method further comprising:
using circuitry to set the first reference voltage on the first conductive line to the third reference voltage, wherein driving the input analog voltage onto the third conductive line comprises driving the input analog voltage onto the third conductive line while the circuitry sets the first reference voltage on the first conductive line to the third reference voltage; and
after driving the input analog voltage onto the third conductive line, using the circuitry to set the first reference voltage on the first conductive line to the fourth reference voltage.

11. The method defined in claim 10 wherein using the circuitry to set the first reference voltage on the first conductive line to the fourth reference voltage comprises adding a negative voltage offset to the input analog voltage.

12. The method defined in claim 11 wherein the first reference voltage is higher than the second reference voltage and wherein setting all of the switches into their first configurations so that all of the first terminals of the capacitors are coupled to the first conductive line at the first reference voltage after driving the input analog voltage onto the third conductive line comprises adding a positive voltage offset to the input analog voltage, wherein the negative voltage offset is only partially canceled out by the positive voltage offset.

13. A method of operating an analog-to-digital converter, wherein the analog-to-digital converter comprises a plurality of capacitors each having a first terminal and a second terminal, a plurality of switches, at least first and second conductive lines, wherein each of the switches is associated with the first terminal of a respective one of the capacitors, wherein each of the switches has a first configuration in which that switch couples the first terminal of its associated capacitor to the first conductive line and has a second configuration in which that switch couples the first terminal of its associated capacitor to the second conductive line, the method comprising:
　setting at least one of the switches in its first configuration;
　while at least the one of the switches is set in its first configuration, using reference voltage generator circuitry, driving a first reference voltage onto the first conductive line;
　while driving the first reference voltage onto the first conductive line; driving an input analog voltage onto a third conductive line, wherein the second terminals of the capacitors are coupled to the third conductive line; and
　after driving the input analog voltage onto the third conductive line and using the reference voltage generator circuitry, driving a second reference voltage that is less than the first reference voltage onto the first conductive line.

14. The method defined in claim 13 further comprising:
　after driving the input analog voltage onto the third conductive line, setting all of the switches into their first configurations so that all of the first terminals of the capacitors are coupled to the first conductive line.

15. The method defined in claim 13 wherein driving the second reference voltage that is less than the first reference voltage onto the first conductive line comprises adding a negative voltage offset to the input analog voltage.

16. The method defined in claim 15 wherein the plurality of capacitors comprise a plurality of binary-weight capacitors and wherein the method further comprises digitizing the offset analog input voltage using the plurality of binary-weight capacitors.

17. The method defined in claim 13 wherein setting at least one of the switches in its first configuration comprises setting at least one of the switches in its second configuration.

18. A system, comprising:
　a central processing unit;
　memory;
　input-output circuitry; and
　an imaging device that includes a plurality of image sensing pixels, wherein the image sensing pixels generate at least one analog image signal and an analog-to-digital converter, wherein the analog-to-digital converter comprises:
　　a plurality of binary-weighted capacitors each having a first terminal selectively coupled to the analog image signal and each having a second terminal;
　　at least first and second conductive lines;
　　a plurality of switches each of which is associated with a respective one of the capacitors, each having has a first configuration in which that switch couples the second terminal of its associated capacitor to the first conductive line, and each having a second configuration in which that switch couples the second terminal of its associated capacitor to the second conductive line;
　　circuitry that controls the switches and adds offset to the analog image signal using the switches and their associated capacitors, wherein the circuitry also controls the switches and their associated capacitors in a successive-approximation digitization of the offset analog image signal;
　　switching circuitry having a first configuration in which a first reference voltage is coupled onto the first conductive line and having a second configuration in which a second reference voltage is coupled onto the first conductive line; and
　　reference voltage generator circuitry that generates the first and second reference voltages and that generates a third reference voltage, wherein the third reference voltage is coupled onto the second conductive line, wherein the first reference voltage is greater than the second reference voltage, and wherein the second reference voltage is greater than the third reference voltage.

19. The system defined in claim 18 wherein the circuitry sets at least one of the switches in its first configuration and sets at least one of the switches in its second configuration when the analog image signal is driven onto the first terminals of the capacitor.

* * * * *